(12) United States Patent
Vengertsev et al.

(10) Patent No.: US 11,681,906 B2
(45) Date of Patent: Jun. 20, 2023

(54) BAYESIAN NETWORK IN MEMORY

(71) Applicant: Micron Technology, Inc., Boise, ID (US)

(72) Inventors: Dmitry Vengertsev, Boise, ID (US); Stewart R. Watson, Boise, ID (US); Jing Gong, Boise, ID (US); Ameya Parab, Millburn, NJ (US)

(73) Assignee: Micron Technology, Inc., Boise, ID (US)

( * ) Notice: Subject to any disclaimer, the term of this patent is extended or adjusted under 35 U.S.C. 154(b) by 470 days.

(21) Appl. No.: 17/006,602

(22) Filed: Aug. 28, 2020

(65) Prior Publication Data

US 2022/0067491 A1  Mar. 3, 2022

(51) Int. Cl.
| | | |
|---|---|---|
| G11C 11/54 | (2006.01) | |
| G06N 3/063 | (2023.01) | |
| G06N 3/084 | (2023.01) | |
| H03M 1/36 | (2006.01) | |
| G11C 13/00 | (2006.01) | |
| G06N 5/046 | (2023.01) | |
| G06N 7/01 | (2023.01) | |

(52) U.S. Cl.
CPC ............. *G06N 3/063* (2013.01); *G06N 3/084* (2013.01); *G06N 5/046* (2013.01); *G06N 7/01* (2023.01); *G11C 11/54* (2013.01); *G11C 13/004* (2013.01); *G11C 13/0009* (2013.01); *G11C 13/0069* (2013.01); *H03M 1/36* (2013.01)

(58) Field of Classification Search
CPC ........ G06N 3/063; G06N 3/084; G06N 5/046; G06N 7/01; G06N 3/047; G06N 3/08; G11C 11/54; G11C 13/0009; G11C 13/004; G11C 13/0069; G11C 11/401; G11C 11/41; G11C 16/10; G11C 16/26; H03M 1/36
See application file for complete search history.

(56) References Cited

U.S. PATENT DOCUMENTS

| | | | |
|---|---|---|---|
| 7,720,779 B1 | 5/2010 | Perry et al. | |
| 8,140,569 B2 | 3/2012 | Hulten et al. | |
| 2014/0279762 A1 | 9/2014 | Malinowski et al. | |
| 2021/0042643 A1* | 2/2021 | Hong | G06N 20/00 |
| 2021/0272040 A1* | 9/2021 | Johnson | G10L 15/063 |

FOREIGN PATENT DOCUMENTS

CN    112084836 A  * 12/2020  ........... G05B 13/042

* cited by examiner

*Primary Examiner* — Jay W. Radke
(74) *Attorney, Agent, or Firm* — Brooks, Cameron & Huebsch, PLLC

(57) ABSTRACT

Apparatuses and methods can be related to implementing a Bayesian neural network in a memory. A Bayesian neural network can be implemented utilizing a resistive memory array. The memory array can comprise programmable memory cells that can be programed and used to store weights of the Bayesian neural network and perform operations consistent with the Bayesian neural network.

20 Claims, 9 Drawing Sheets

BAYESIAN NETWORK IN MEMORY

TECHNICAL FIELD

The present disclosure relates generally to memory, and more particularly to apparatuses and methods associated with implementing a Bayesian neural network in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications including, but not limited to personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

Figure 1:
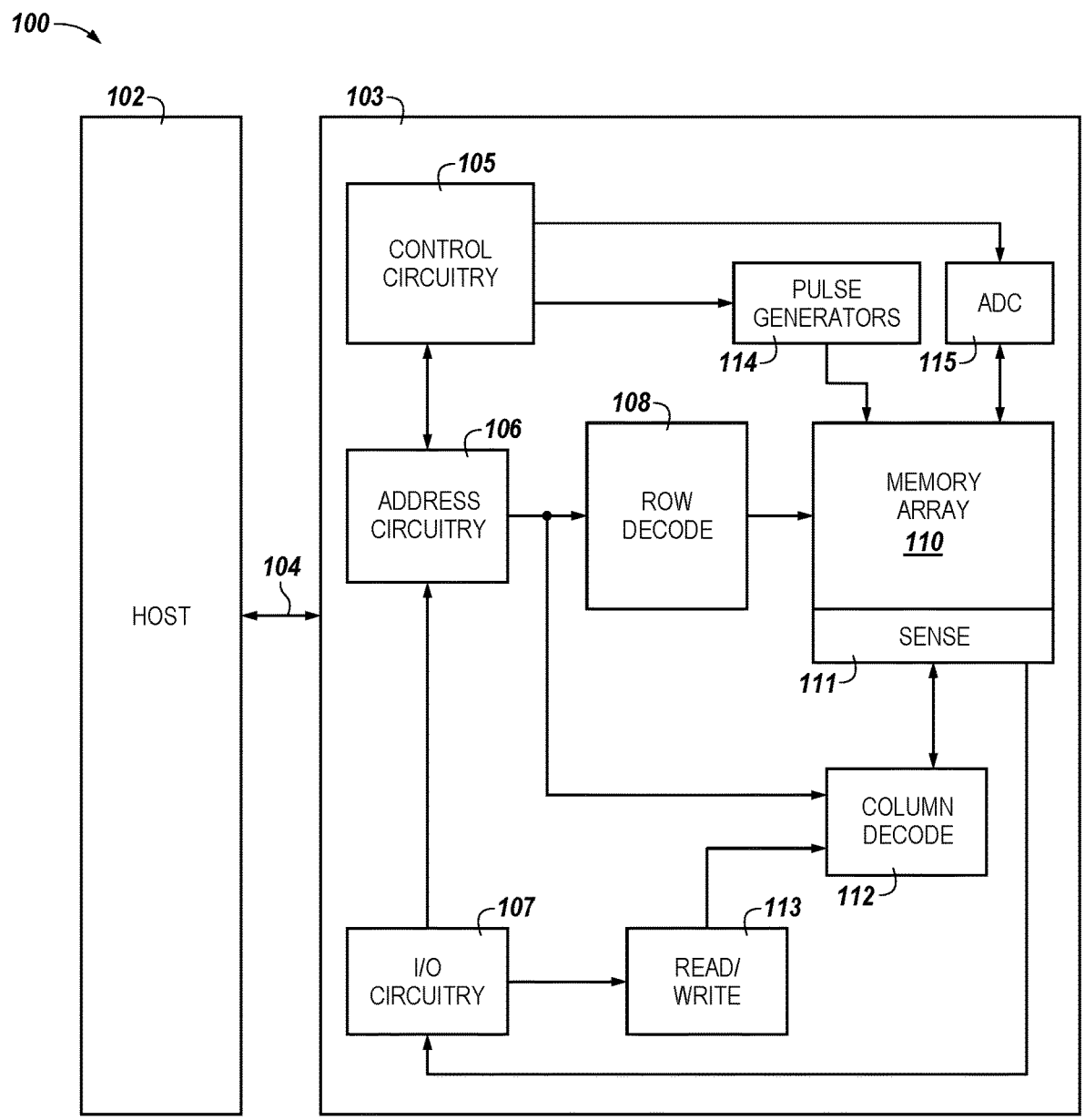
FIG. 1 is a block diagram of an apparatus in the form of a computing system including a memory device in accordance with a number of embodiments of the present disclosure.

The present disclosure includes apparatuses and methods related to implementing a Bayesian neural network in memory. A Bayesian neural network can be implemented (e.g., trained and used in inference) in memory utilizing a memory array.

As used herein, a probabilistic neural network is a feed forward neural network architecture that estimates uncertainty. A Bayesian neural network is an example of a probabilistic neural network. A Bayesian neural network is a neural network architecture with posterior inference. A Bayesian neural network can also be a stochastic neural network. As used herein, a stochastic neural network is a neural network architecture utilizing random variations such as stochastic transfer functions, stochastic weights, and/or stochastic biases.

The examples described herein describe a neural network that implements stochastic weights and biases and which may provide posterior inference. The examples described herein can be implemented using a Bayesian neural network.

Mission critical systems, such as medical systems or automotive systems, utilize estimation of uncertainty in neural network models. The predication of uncertainty can be used to assess how much to trust a forecast produced by a neural network model. For example, in healthcare, reliable uncertainty estimates can prevent overconfident decisions for rare or novel patient conditions. In autonomous agents that actively explore their environment, uncertainty estimates can be used to identify which data points are most informative. Bayesian neural networks can be, for example, used to identify an action to take with regard to steering a vehicle. For instance, a Bayesian neural network can receive an image of an intersection. The image can be provided as a vector of inputs to the Bayesian neural network. The Bayesian neural network can generate a position of a steering wheel and a certainty associated with the position of the steering wheel.

However, traditional implementations of Bayesian neural networks may provide true Gaussian random variables ineffectively. Traditional implementation of Bayesian neural networks may also perform computations of high-dimensional integrals inefficiently.

Aspects of the present disclosure address the above and other deficiencies. For instance, a number of embodiments employ hardware of a memory device to create Gaussian random variables in an efficient manner as compared to traditional implementations of Bayesian neural networks. A number of embodiments implement Bayesian neural networks in a memory device to utilize the hardware of the memory device to take advantage of high-dimensional integrals efficiently.

A Bayesian neural network can be implemented in a memory device utilizing a number of memory cells and one or more stochastic pulse generators. The concurrent use of memory cells to implement a neural network can increase parallelism.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 310 in FIG. 3. Analogous elements within a Figure may be referenced with a hyphen and extra numeral or letter. See, for example, elements 442-1, 442-2, 442-3, 442-4 in FIGS. 4A and 4B. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a block diagram of an apparatus in the form of a computing system 100 including a memory device 103 in accordance with a number of embodiments of the present disclosure. As used herein, a memory device 103, memory array 110, and/or a host 102, for example, might also be separately considered an "apparatus".

In this example, the computing system 100 includes a host 102 coupled to memory device 103 via an interface 104. The computing system 100 can be a personal laptop computer, a desktop computer, a digital camera, a mobile telephone, a memory card reader, or an Internet-of-Things (IoT) enabled device, among various other types of systems. Host 102 can include a number of processing resources (e.g., one or more processors, microprocessors, or some other type of controlling circuitry) capable of accessing memory 102. The computing system 100 can include separate integrated circuits, or both the host 102 and the memory device 103 can be on the same integrated circuit. For example, the host 102 may be a system controller of a memory system comprising multiple memory devices 103, with the system controller providing access to the respective memory devices 103 by another processing resource such as a central processing unit (CPU).

For clarity, the computing system 100 has been simplified to focus on features with particular relevance to the present disclosure. The memory array 110 can be a DRAM array, SRAM array, STT RAM array, PCRAM array, TRAM array, RRAM array, NAND flash array, NOR flash array, and/or 3D Cross-point array, for instance. The array 110 can comprise memory cells arranged in rows coupled by access lines (which may be referred to herein as word lines or select lines) and columns coupled by sense lines (which may be referred to herein as digit lines or data lines). Although the memory array 110 is shown as a single memory array, the memory array 110 can represent a plurality of memory array arraigned in banks of the memory device 103.

The memory device 103 includes address circuitry 106 to latch address signals provided over the interface 104. The interface can include, for example, a physical interface employing a suitable protocol (e.g., a data bus, an address bus, and a command bus, or a combined data/address/command bus). Such protocol may be custom or proprietary, or the interface 104 may employ a standardized protocol, such as Peripheral Component Interconnect Express (PCIe), Gen-Z interconnect, cache coherent interconnect for accelerators (CCIX), or the like. Address signals are received and decoded by a row decoder 108 and a column decoder 112 to access the memory arrays 110. Data can be read from memory arrays 110 by sensing voltage and/or current changes on the sense lines using sensing circuitry 111. The sensing circuitry 111 can be coupled to the memory arrays 110. Each memory array and corresponding sensing circuitry can constitute a bank of the memory device 103. The sensing circuitry 111 can comprise, for example, sense amplifiers that can read and latch a page (e.g., row) of data from the memory array 110. The I/O circuitry 107 can be used for bi-directional data communication with the host 102 over the interface 104. The read/write circuitry 113 is used to write data to the memory arrays 110 or read data from the memory arrays 110. As an example, the circuitry 113 can comprise various drivers, latch circuitry, etc.

Control circuitry 105 decodes signals provided by the host 102. The signals can be commands provided by the host 102. These signals can include chip enable signals, write enable signals, and address latch signals that are used to control operations performed on the memory array 110, including data read operations, data write operations, and data erase operations. In various embodiments, the control circuitry 105 is responsible for executing instructions from the host 102. The control circuitry 105 can comprise a state machine, a sequencer, and/or some other type of control circuitry, which may be implemented in the form of hardware, firmware, or software, or any combination of the three. In some examples, the host 102 can be a controller external to the memory device 103. For example, the host 102 can be a memory controller which is coupled to a processing resource of a computing device. Data can be provided to the memory array 110 and/or from the memory array via the data lines coupling the memory array 110 to the I/O circuitry 107.

In various instances, the memory array 110 can be a resistive memory array. The resistive memory array can be a resistive programmable device. That is, the memory array 110 can be programmed by modifying the resistance of the memory cells included in the memory array 110. The memory cells can be programed to a specific resistance (or conductance). With respect to programming the memory cells and/or representing values with the memory cells, the terms resistance and conductance are used interchangeably herein since any change in resistance is accompanied by a proportional change in conductance. The resistance of the memory cells can represent values that can be used in the performance of operations. For instance, the resistance of the memory cells can be used to perform a multiplication operation, among other types of operations.

In various examples, the resistance of the memory cells can be programmed to represent weight values and bias values of a neural network. The ability to program the resistance of the memory cells can contribute to the ability to perform forward updates, backward updates, and weight updates utilizing a limited number of banks of the memory array 110. The weights and the biases can be selected at random utilizing the pulse generators 114 further described in FIG. 3. The results of the operations performed at the layers of the Bayesian neural network can be converted to voltage signals utilizing the analog-to-digital converters (ADCs) 115 further described in FIG. 3. Although the pulse generators 114 and ADCs 115 are illustrated as being coupled directly to the memory array 110, in some embodiments the pulse generators 114 and/or ADCs 115 can be coupled to the memory array 110 via the sensing circuitry 111, the row decoder 108, or the column decoder 112.

Figure 2:
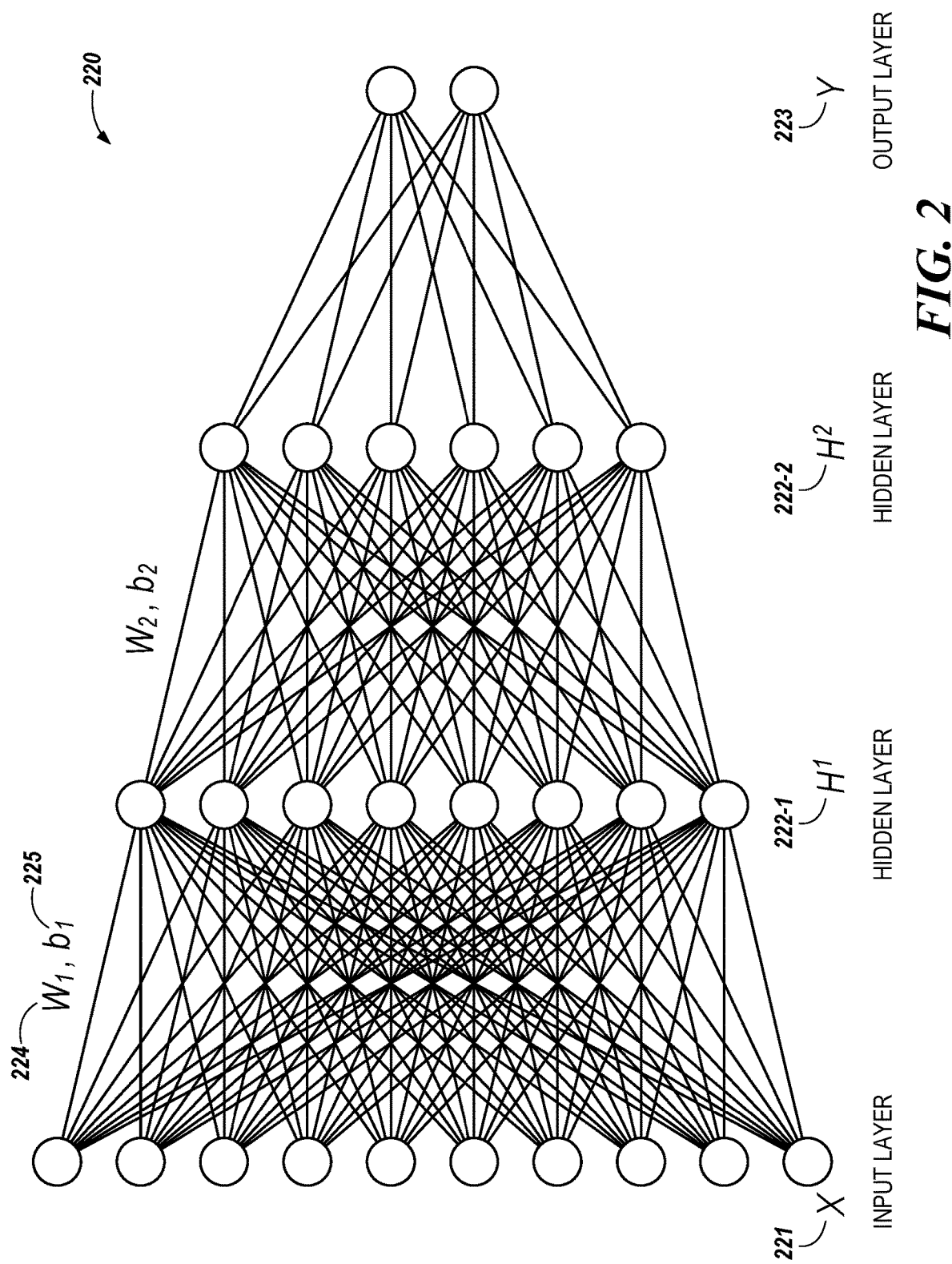
FIG. 2 illustrates an example Bayesian neural network in accordance with a number of embodiments of the present disclosure.

FIG. 2 illustrates an example Bayesian neural network 220 in accordance with a number of embodiments of the present disclosure. The Bayesian neural network 220 can comprise an input layer 221, a hidden layer 222-1, a hidden layer 222-2, and an output layer 223. The hidden layers 222-1, 222-2 are referred to as hidden layers 222.

The input layer 221 can receive a plurality of input values and can provide the input values to the hidden layer 222-1. The hidden layers 222 can perform a plurality of computations on the inputs and intermediary values using weights 222 (e.g., $W_1$, $W_2$) and biases 225 (e.g., $b_1$, $b_2$).

Each of hidden layers 222 can comprise a different set of weights that can be used to perform computations of the Bayesian neural network 220. For instance, the weights $W_1$ represent a plurality of weight values. The weight values corresponding the weights $W_1$ can include, for example, the weight values $W_{11}, W_{12}, \ldots, W_{1N}$. The biases $b_1$ represents a plurality of bias values. The bias values corresponding to the biases $b_1$ can include, for example, the bias values $b_{11}$, $b_{12}, \ldots, b_{1N}$. FIG. 2 shows the Bayesian neural network 220 as comprising two hidden layers 222. However, Bayesian neural networks can comprise more than two hidden layers 222. The examples described herein are illustrative and can be expanded to cover different implementations of Bayesian neural networks.

The Bayesian neural network 220 shown in FIG. 2 is referred to as a fully connected Bayesian neural network 220 given that each of the nodes of each layer are connected to each of the nodes of an adjacent layer. For instance, the input layer 221 can be described as comprising a plurality of input nodes and the hidden layer 222-1 is shown to comprise a plurality of hidden nodes. Each of the input nodes can be connected to each of the hidden nodes of the hidden layer 222-1. Likewise, each of the nodes of the hidden layer 222-1 is connected to each of the nodes of the hidden layer 222-2.

Each connection between nodes can be assigned a corresponding weight value and a bias value. The output of each of the nodes in the hidden layer 222-1 can be provided to each of the nodes in the hidden layer 222-2. A number of operations can be performed utilizing the output of the nodes in the hidden layer 222-1, corresponding weight values from the weights 224, and corresponding bias values from the biases 225. The nodes from the hidden layer 222-2 can generate an output which can be provided as an input to the output layer 223. An output of the output layer 223 can be an output of the Bayesian neural network 220.

In various examples, the weights 224 and the biases 225 are random variables. Each of the weights 224 and each of the biases 225 is assigned a Gaussian distribution having a mean and standard deviation. For example, the weights 224 have a Gaussian distribution having a mean $\mu_i^W$ and a standard deviation $\rho_i^W$. The biases 225 have a Gaussian distribution having a mean $\mu_i^b$ and a standard deviation $\rho_i^b$, wherein i represents a layer from the layers of the Bayesian neural network such as the hidden layers 222-1. Although the weights 224 are described as having a Gaussian distribution having a mean $\mu_i^W$ and a standard deviation $\rho_i^W$, each of the weights 224 from the weights $W_{11}, W_{12}, \ldots, W_{1N}$ and the weights $W_{21}, W_{22}, \ldots, W_{2N}$ can have a separate Gaussian distribution having a mean and a standard distribution. Also, each of the biases 225 from the biases $b_{11}, b_{12}, \ldots, b_{1N}$ and the biases $b_{21}, b_{22}, \ldots, b_{2N}$ can have a separate Gaussian distribution having a mean and a standard deviation.

Each of the input layer 221, the hidden layers 222, and the output layer 223 can be implemented in one or more banks of the memory array. Furthermore, a plurality of operations performed in the layers 221, 222, and 223 can be implemented using one or more banks of the memory array.

An output of the Bayesian neural network 220 can be a conditional distribution which is expressed as $P(\hat{Y}|X^{new}, w, D)$. In the conditional distribution $P(\hat{Y}|X^{new}, w, D)$, w is a plurality of weights, D is training data, $X^{new}$ is a input to a Bayesian neural network 220, and $\hat{Y}$ is a result of performing the Bayesian neural network 220. $P(\hat{Y}|X^{new}, w, D)$ can be described as an estimation of uncertainty of a result $\hat{Y}$ provided the input $X^{new}$, the weights w, and the training data D.

$P(\hat{Y}|X^{new}, w, D)$ can be equal to $\Sigma_w P(\hat{Y}|X^{new})P(w|D)$. However, calculating $P(w|D)$ may be infeasible due to computation capabilities. $P(w|D)$ can be approximated with $q(w|\theta)$ where $\theta$ represents the parameters $\{\mu, \rho\}$ such that $\theta = \{\mu, \rho\}$.

The parameters $\theta$ can be selected to minimize $F(D, \theta)$ which is referred to as a cost function. The cost function $F(D, \theta)$ can also be referred to as a KL-divergence. A KL-divergence is a measure of how one probability distribution is different from a second probability distribution. The cost function $F(D, \theta)$ can provide a measure of how the distribution $P(w|D)$ differs from the distribution $q(w|\theta)$ such that $F(D, \theta)$ provides a distance between $P(w|D)$ and $q(w|\theta)$.

The cost function $F(D, \theta)$ can be defined as $F(D, \theta) \approx \Sigma_{i \in layers}[\log q(w^i|\theta) - \log P(w^i) - \log P(D|w^i)]$ where $q(w^i|\theta)$ is referred to a variational posterior and $P(w^i)$ is referred to as a prior and where $w^i$ denotes the ith Monte Carlo sample drawn from the variational posterior $q(w^i|\theta)$. $w^i$ can be selected based on a random number. $P(D|w^i)$ is a likelihood that measures how well a model of the Bayesian neural network 220 having the weights w fits the training data D. The variational posterior is defined as $q(w^i|\theta) = N(\theta) = N(\{\mu^{w_i}, \rho^{w_i}, \mu^{b_i}, \rho^{b_i}\}_i)$. The variational posterior is a Gaussian distribution. The prior is defined as $P(w) = \Pi_j[\pi N(w_j|0, \sigma_1^2) + (1-\pi)N(w_j|0, \sigma_2^2)]$. A Gaussian mixture model is used to model the prior dependent on the weights w, where $\sigma_1$ and $\sigma_2$ are constants representing a standard deviation.

Figure 3:
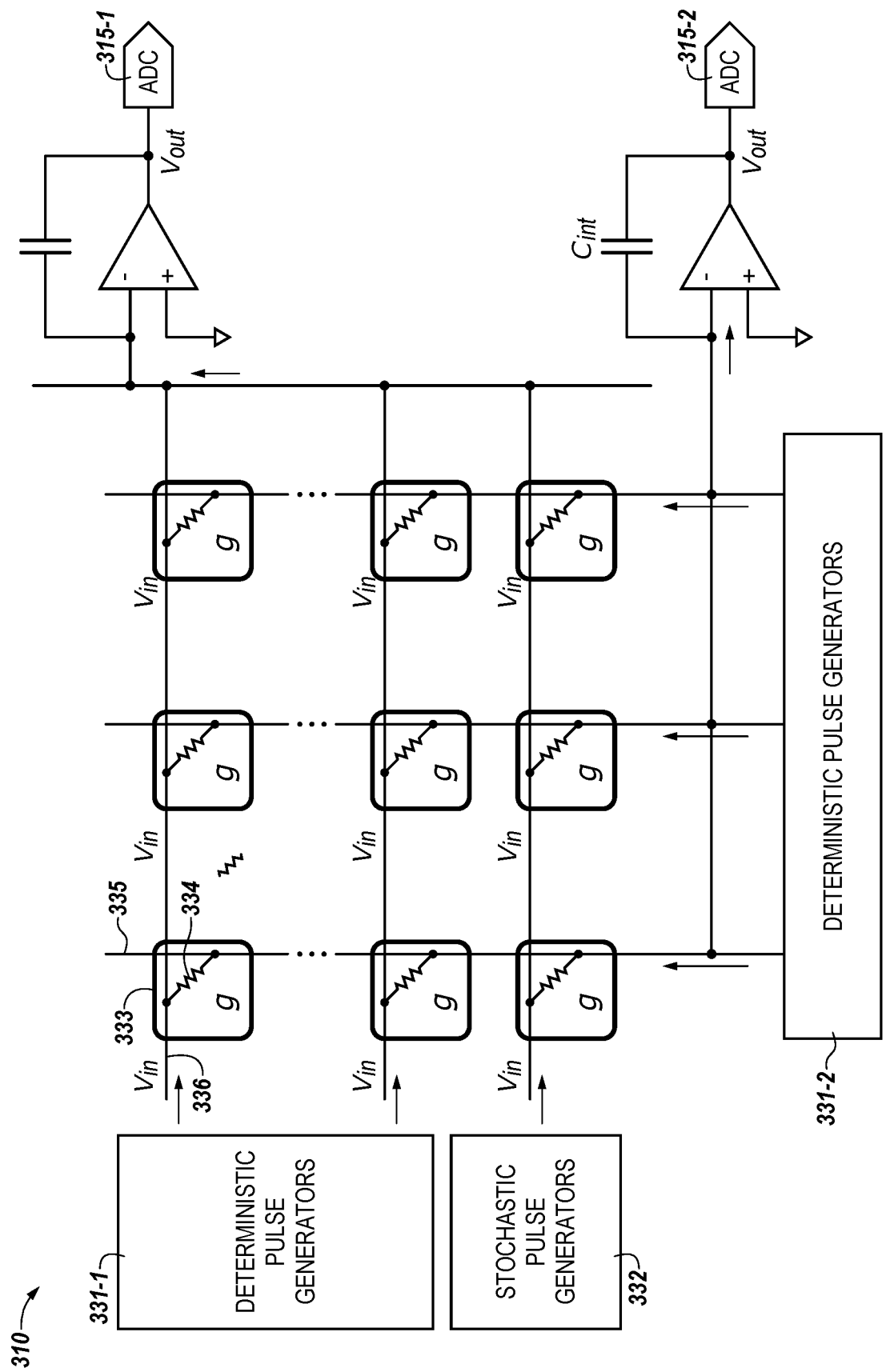
FIG. 3 illustrates an example memory array in accordance with a number of embodiments of the present disclosure.

FIG. 3 illustrates an example memory array 310 in accordance with a number of embodiments of the present disclosure. The memory array 310 comprises a plurality of memory cells 333. The memory cells 333 are coupled to sense lines 335 and access lines 336.

The memory cells 333 can be resistive memory cells. The resistive memory cells 333 can comprise terminals that couple the memory cells 333 to the sense lines 335 and the access lines 336. The terminals of the memory cells 333 can be coupled to each other via a resistive element 334. The resistive element 334 can be a resistance variable material (e.g., a material programmable to multiple different resistance states, which can represent multiple different data states) such as, for example, a transition metal oxide material, or a perovskite including two or more metals (e.g., transition metals, alkaline earth metals, and/or rare earth metals). Other examples of resistance variable materials that can be included in the storage element of resistive memory cells 223 can include various materials employing trapped charges to modify or alter conductivity, chalcogenides formed of various doped or undoped materials, binary metal oxide materials, colossal magnetoresistive materials, and/or various polymer based resistive variable materials, among others. Embodiments are not limited to a particular resistance variable material or materials. In various instances, the conductance of the memory cells 333 can be programmed by programming the resistive element 334. For instance, control circuitry of a memory device can program the resistive element 334. Actions performed by a memory device, the memory array 310, the memory cells 334, a pulse generator (e.g., deterministic pulse generators 331-1, 331-2, and stochastic pulse generators 332), and/or analog-to-digital converters 315-1, 315-2 can be said to be performed by or caused by control circuitry of the memory device.

The conductance can represent a weight value of a Bayesian neural network. For example, the conductance of the memory cells 333 can represent weight values of a layer of the Bayesian neural network. As used herein, the terms weights and weight values are used interchangeably.

The memory cells 333 can be used in the performance of operations. The memory cells 333 can be controlled to perform matrix multiplication in parallel and locally to the memory device hosting the memory array 310. Matrix multiplication can be performed utilizing inputs and a plurality of weight values. The inputs can be provided as an input vector. The plurality of weight values, which are represented by the conductance of the memory cells 333, can be provided as a weight matrix. The inputs are denoted in FIG. 3 as $V_{in}$. $V_{in}$ and can comprise the vector $$\begin{bmatrix} x_0 \\ \vdots \\ x_n \end{bmatrix}.$$

Each of the inputs (e.g., $x_0 \ldots x_n$) can be provided to the memory array 310 via signal lines such as the sense lines 335 or the access lines 336. FIG. 3 shows that the inputs can be provided via the access lines 336 and/or the sense lines 335. Each of the access lines 336 can provide a portion of the input (one of the input values). For example, a first access line can provide the input value $x_0, \ldots$, and a last access line can provide the input value $x_n$, where n is equal to a quantity of access lines 335 or is less than the quantity of access lines 335. The inputs are provided by pulse generators 331 and the pulse generator 332.

The inputs can be multiplied with a weight matrix comprising the weight values stored by the memory array 310 and which are represented by the conductance of the memory cells 333. The weight matrix is denoted as $$\begin{bmatrix} w_{00} & \cdots & w_{0n} \\ \vdots & \ddots & \vdots \\ w_{n0} & \cdots & w_{nn} \end{bmatrix}.$$

Each of the memory cells 333 can store a different weight value represented its conductance.

The outputs of the matrix multiplication can be provided as an output vector $$\begin{bmatrix} h_0 \\ \vdots \\ h_n \end{bmatrix}.$$

Each of the outputs (e.g., $h_0 \ldots h_n$) can be provided via a different one of the signal lines such as the sense lines 335 or the access lines 336. Matrix multiplication is denoted as $$\begin{bmatrix} h_0 \\ \vdots \\ h_n \end{bmatrix} = \begin{bmatrix} w_{00} & \cdots & w_{0n} \\ \vdots & \ddots & \vdots \\ w_{n0} & \cdots & w_{nn} \end{bmatrix}^T \begin{bmatrix} x_0 \\ \vdots \\ x_n \end{bmatrix} \text{ or } h = Wx.$$

or h=Wx. In various examples, multiple instances of matrix multiplication can be performed in the memory array 310. A single instance of matrix multiplication can also be performed in the memory array 310.

As such, the memory array 310 and/or banks of the memory array 310 can be described as processing data. As used herein, processing includes utilizing memory (e.g., memory array and/or a bank of memory) to generate an output responsive to receipt of an input. The output can be generated using the resistance of the memory cells of the memory and the input to the memory.

The inputs can be provided by pulse generators 331-1, 331-2, 332 (e.g., voltage pulse generator). The pulse generators 331-1, 331-2, 332 can comprise hardware to generate voltage pulses. In various example, the pulse generators 331-1, 331-2, 332 can receive a voltage input or a plurality of voltage inputs and can generate a plurality of voltage pulses. In some examples, the pulse generators 332 can be a stochastic random number generator. The pulse generator 332 can implement a drop out scheme which can be used along with the generation of random numbers to sample. The pulse generators 331-1, 331-2 can be deterministic pulse generators.

The outputs can be provided via the sense lines 335 or the access lines 336. The outputs can be interpreted as current signals. The outputs can be provided to analog-to-digital converters (ADCs) 315-1, 315-2. The ADCs 315-1, 315-2 can receive a current and can output a voltage. The ADC 315-1 can measure the current provided by the access lines 336. The ADC 315-2 can measure the current provided by the sense lines 335. The output of the ADCs 315-1, 315-2 can be a voltage signal that can be stored in registers of the memory device or which can be provided directly to a voltage pulse generator coupled to a different memory array or a same memory array pending reprogramming of the memory array 310.

For example, the memory array 310 can be used to generate an output which can be converted to a voltage signal by the ADCs 315-1, 315-2. The voltage signal can be stored in registers of the memory device. The memory array 310 can then be reprogramed by resetting the conductance of the memory cells 333. Resetting the conductance of the memory cells 333 can reprogram the memory array 310 to function as a different layer of the Bayesian neural network. The output stored in the registers can be provided as an input to the pulse generators 331-1, 331-2, 332 which can provide an input to the memory array 310.

FIG. 3 shows the operation of the memory array 310 to implement a layer of a Bayesian neural network. Multiple layers of the Bayesian neural network can be implemented to forward propagate the Bayesian neural network which can result in the generation of an inference. The Bayesian neural network can also be forward propagated to prepare for backward propagation as described below.

The resistive components 334 can be programmed by providing inputs via the sense lines 335 and the access lines 336. Operations can be performed by providing inputs through one of the sense lines 335 or the access lines 336. Forward propagating can be performed by providing inputs through one of the sense lines 335 or the access lines 336. Backward propagating can be performed by providing inputs through the other of the sense lines 335 or the access lines 336. For example, with respect to FIG. 3, inputs (the x vector) can be provided via the access lines 336 to the memory cells 333, which store the weight matrix w. The x vector can be the output from the deterministic pulse generators 331-1. The deterministic pulse generators 331-1 can be operated to generate a known, defined output. Providing the inputs to the memory cells 333 effectively multiplies the x vector by the weight matrix w and results in the generation of an output (the h vector). In various examples, the x vector can be the output from the stochastic pulse generators 332. The x vector can comprise random variable generated by the stochastic pulse generators 332. The weight matrix w can be stored in the memory cells 333 using the deterministic pulse generators 331-1 and the deterministic pulse generators 331-2. The deterministic pulse generators 331-1, 331-2 can provide inputs concurrently to store the weight matrix w in the memory cells 333. The deterministic pulse generators 331-1 can provide inputs via access lines 336 while the deterministic pulse generators 331-2 provide inputs via the sense lines 335.

Figure 4A:
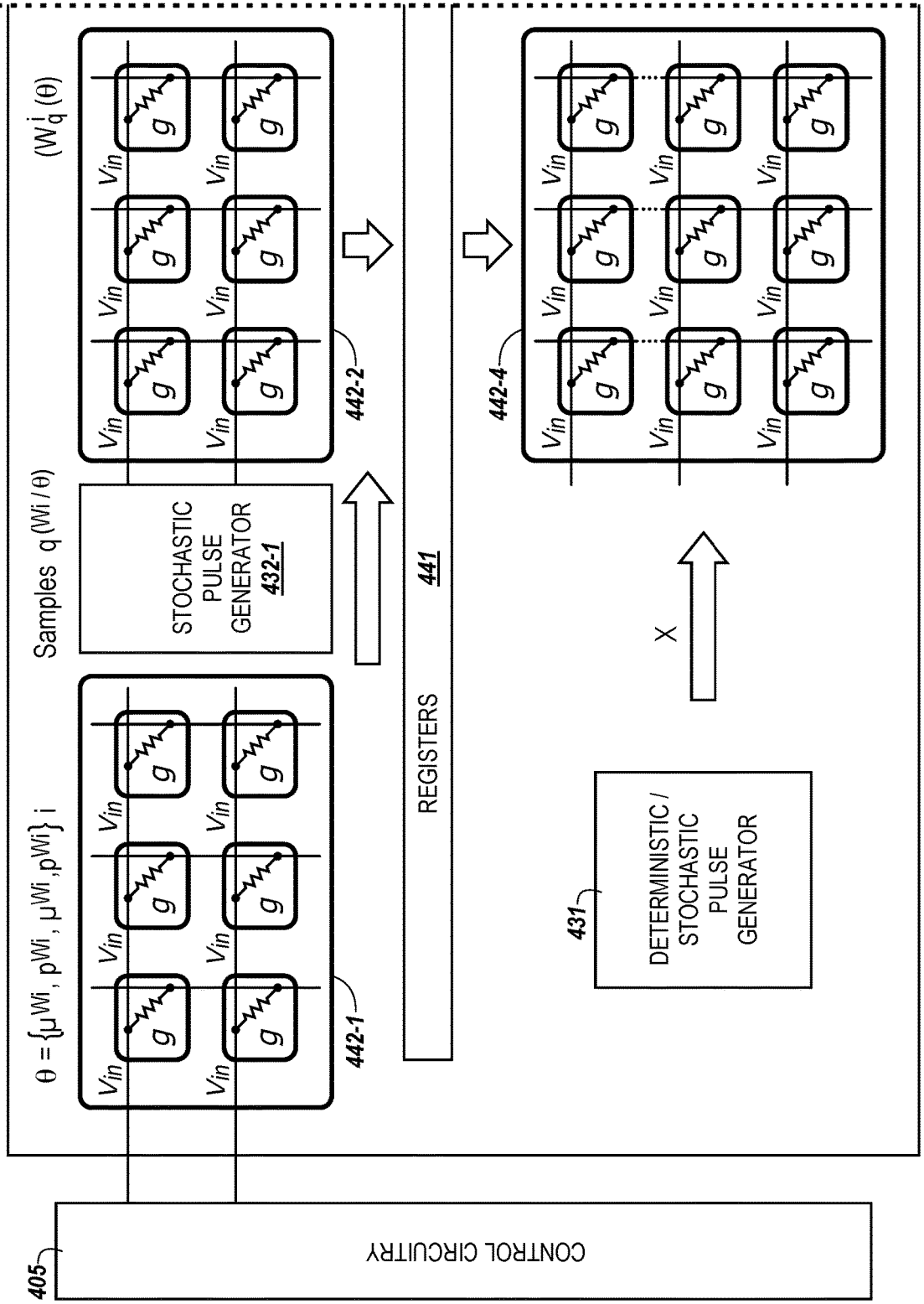
FIG. 4A illustrates a first portion of an example flow for performing forward propagation in accordance with a number of embodiments of the present disclosure.
Figure 4B:
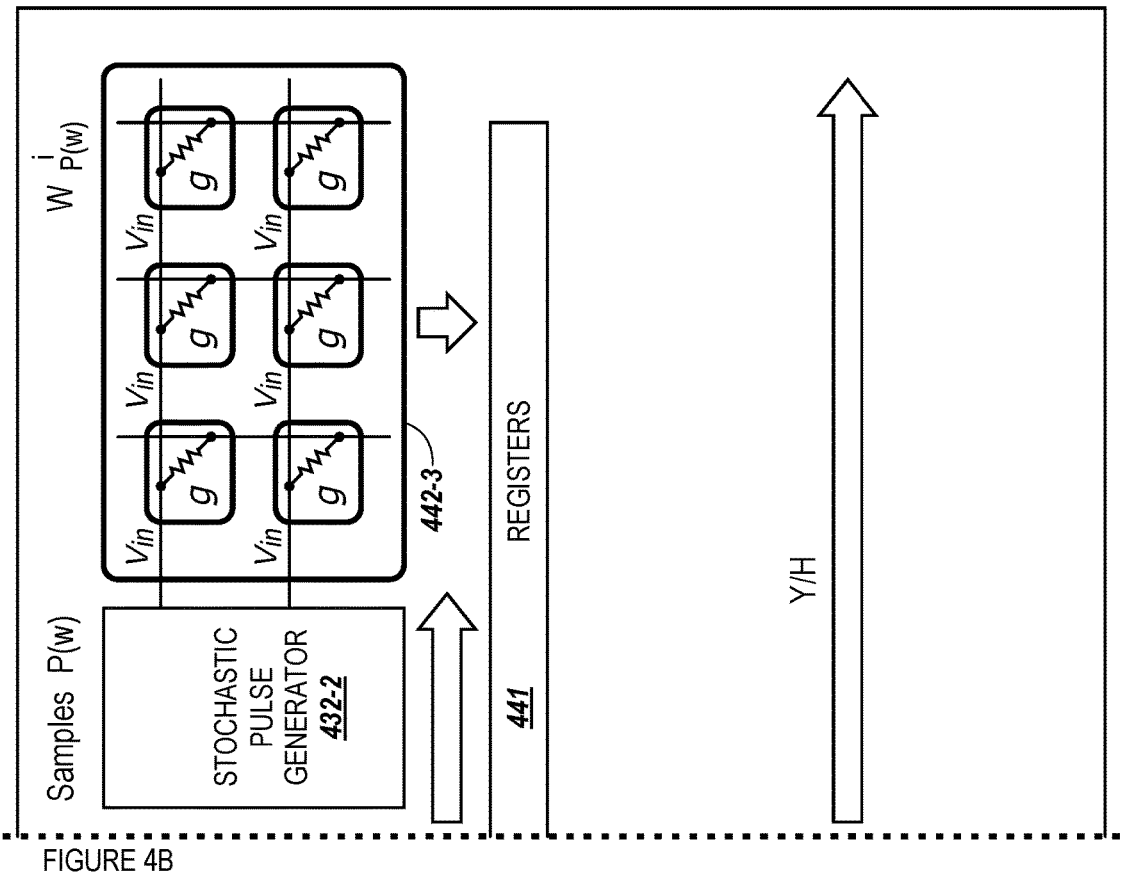
FIG. 4B illustrates a second portion of an example flow for performing forward propagation in accordance with a number of embodiments of the present disclosure.

FIGS. 4A and 4B illustrates a first portion and a second portion of an example flow for performing forward propagation in accordance with a number of embodiments of the present disclosure. Due to the size of the figure, FIG. 4 is split into two pages as FIG. 4A and FIG. 4B. Forward propagation can be performed utilizing a plurality of banks of a memory array. For instance, forward propagation is shown as being performed utilizing banks 442-1, 442-2, 442-3, 442-4. FIG. 4 shows the forward propagation of a layer of a Bayesian neural network.

Forward propagation can include generating a plurality of weight values shown as $w_{P(w)}{}^i$ utilizing the banks 442-1, 442-2, 442-3 and the stochastic pulse generators 432-1, 432-2. The plurality of weight values can be utilized by the bank 442-4 to generate an output of a layer of the Bayesian neural network.

The bank 442-1 can store the parameters $\theta=\{\mu^{W_i}, \rho^{W_i}, \mu^{b_i}, \rho^{b_i}\}_i$ for a given layer of the Bayesian neural network. The parameters $\theta$ can be provided to a stochastic pulse generator 432-1. The stochastic pulse generator 432-1 can generate a plurality of samples from $q(w^i|\theta)$ utilizing the parameters $\theta$. The plurality of weight values sampled from $q(w^i|\theta)$ can be stored utilizing the memory cells of the bank 442-2 such that the weight values $w_{q(\theta)}{}^i$ are stored in the memory cells of the bank 442-2. The weight values $w_{q(\theta)}{}^i$ can be provided to the stochastic pulse generator 432-2 from the memory cells of the stochastic pulse generator 432-1. The stochastic pulse generator 432-2 can sample from P(w) utilizing the weight values $w_{q(\theta)}{}^i$. The sampled weight values $w_{P(w)}{}^i$ provided by the stochastic pulse generator 432-2 can be stored in the memory cells of the memory bank 442-3. The banks 442-1, 4422-2, 442-3 can be updated every training epoch, where a training epoch is defined as one forward and backward cycle.

The weight values $w_{q(\theta)}{}^i$ and the weight values $w_{P(w)}{}^i$ can be stored in the registers 441 of a memory device hosting the banks 442-1, 442-2, 442-3, 442-4. The bank 442-4 can receive an input X provided by a pulse generator 431. In various examples, the input X can be provided by a host along with instructions to generate an inference utilizing the Bayesian neural network.

The weight values $w^i$ retrieved from the registers 441 can be programmed to the bank 442-4. The input X and the weight values $w^i$ can be used to generate an output for a layer of the Bayesian neural network. An output for a hidden layer of the Bayesian neural network can be denoted as h while an output of the Bayesian neural network can be denoted as y. The pulse generator 431 can be a deterministic pulse generator or a stochastic pulse generator.

The control circuitry 405 can utilize the banks 442-1, 442-2, 442-3, 442-4 to implement the forward propagation of a layer of the Bayesian neural network. The control circuitry 405 can control the banks 442-1, 442-2, 442-3, 442-4 by programming the memory cells of the banks 442-1, 442-2, 442-3, 442-4 and by controlling the pulse generators 432-1, 432-2, 431 to provide inputs to the banks 442-1, 442-2, 442-3, 442-4.

Figure 5:
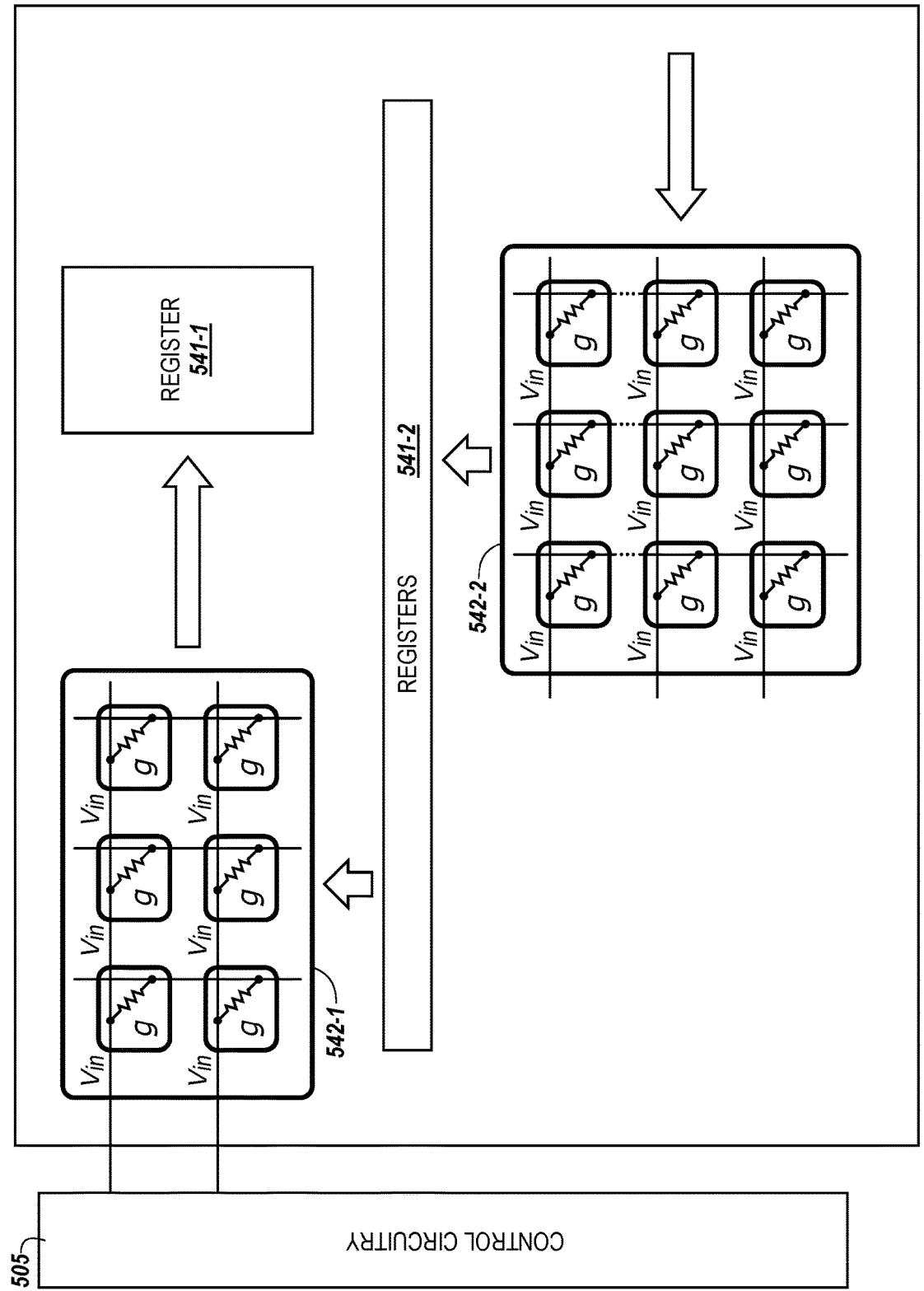
FIG. 5 illustrates an example flow for performing backward propagation in accordance with a number of embodiments of the present disclosure.

FIG. 5 illustrates an example flow for performing backward propagation in accordance with a number of embodiments of the present disclosure. The control circuitry 505 can be configured to perform the backward propagation utilizing banks 542-1, 542-2 and registers 541-1, 541-2.

The backward propagation of a Bayesian neural network comprises calculating a plurality of partial derivatives. For example, the partial derivative of the loss function with respect to the parameters $\theta$ can be provided to the bank 542-2 of a memory array by a deterministic pulse generator. The partial derivative of the loss function can be provided as $$\frac{\partial F(D, \theta)}{\partial \theta}.$$

The partial derivative of the loss function with respect to the parameters $\theta$ can be provided as a vector of values such that each of the vector values is provided via one of the access lines of the bank 542-2. The input $$\frac{\partial F(D, \theta)}{\partial \theta}$$

to the bank 542-2 causes the generation of an output that is equal to a partial derivative of the F(w,$\theta$) with respect to w as $$\frac{\partial F(w, \theta)}{\partial w}.$$

The partial derivative $$\frac{\partial F(w, \theta)}{\partial w}$$

can be stored in the registers 541-2.

The controller can provide $$\frac{\partial F(w, \theta)}{\partial w}$$

(e.g., from the registers 541-2) to the bank 542-1. The bank 542-1 can be programmed to store the parameters $\theta=\{\mu^{W_i}, \rho^{W_i}, \mu^{b_i}, \rho^{b_i}\}_i$. This input to the bank 542-1 causes the generation, using the parameters $\theta$ stored in the bank 542-1, of outputs equal to a partial derivative of F(w,$\theta$) with respect to the mean as $$\frac{\partial F(w, \theta)}{\partial \mu}$$

and the partial derivative of F(w,$\theta$) with regards to the standard deviation as $$\frac{\partial F(w, \theta)}{\partial \rho}.$$

In various instances $$\frac{\partial F(w, \theta)}{\partial w}$$

can be provided to the bank 542-1 to generate $$\frac{\partial F(w, \theta)}{\partial \mu}$$

in a first number of operations.

$$\frac{\partial F(w, \theta)}{\partial w}$$

can be provided a second time to the bank 542-1 to generate $$\frac{\partial F(w, \theta)}{\partial \rho}.$$

In other examples, $$\frac{\partial F(w, \theta)}{\partial \mu}$$

and $$\frac{\partial F(w, \theta)}{\partial \rho}$$

can be generated concurrently using a same number of operations.

The partial derivative $$\frac{\partial F(D, \theta)}{\partial \theta}$$

can be generated by the banks 542-1, 542-2 or a different bank than those shown here. The partial derivative $$\frac{\partial F(D, \theta)}{\partial \theta}$$

can also be generated by the control circuitry 505 or a host, in some examples. In various examples, the control circuitry 505 can cause a deterministic pulse generator to provide the partial derivative $$\frac{\partial F(D, \theta)}{\partial \theta}$$

to the bank 541-2.

Values for $$\frac{\partial F(w, \theta)}{\partial \mu}$$

and $$\frac{\partial F(w, \theta)}{\partial \rho}$$

can be stored in the registers 541-1. Although the registers 541-1 and 541-2 are shown as different registers, the registers 541-1 and 541-2 can be a same plurality of registers or a different plurality of registers.

In various examples, the quantity of banks used in backward propagation of a layer of a Bayesian neural network can be less than the quantity of banks used in forward propagation of the layer of the Bayesian neural network. For example, the quantity of banks used to generate the partial derivatives stored in the registers 541-1 for a given layer of the Bayesian neural network can be less than the quantity of banks used to generation an inference for the layer of the Bayesian neural network.

Figure 6:
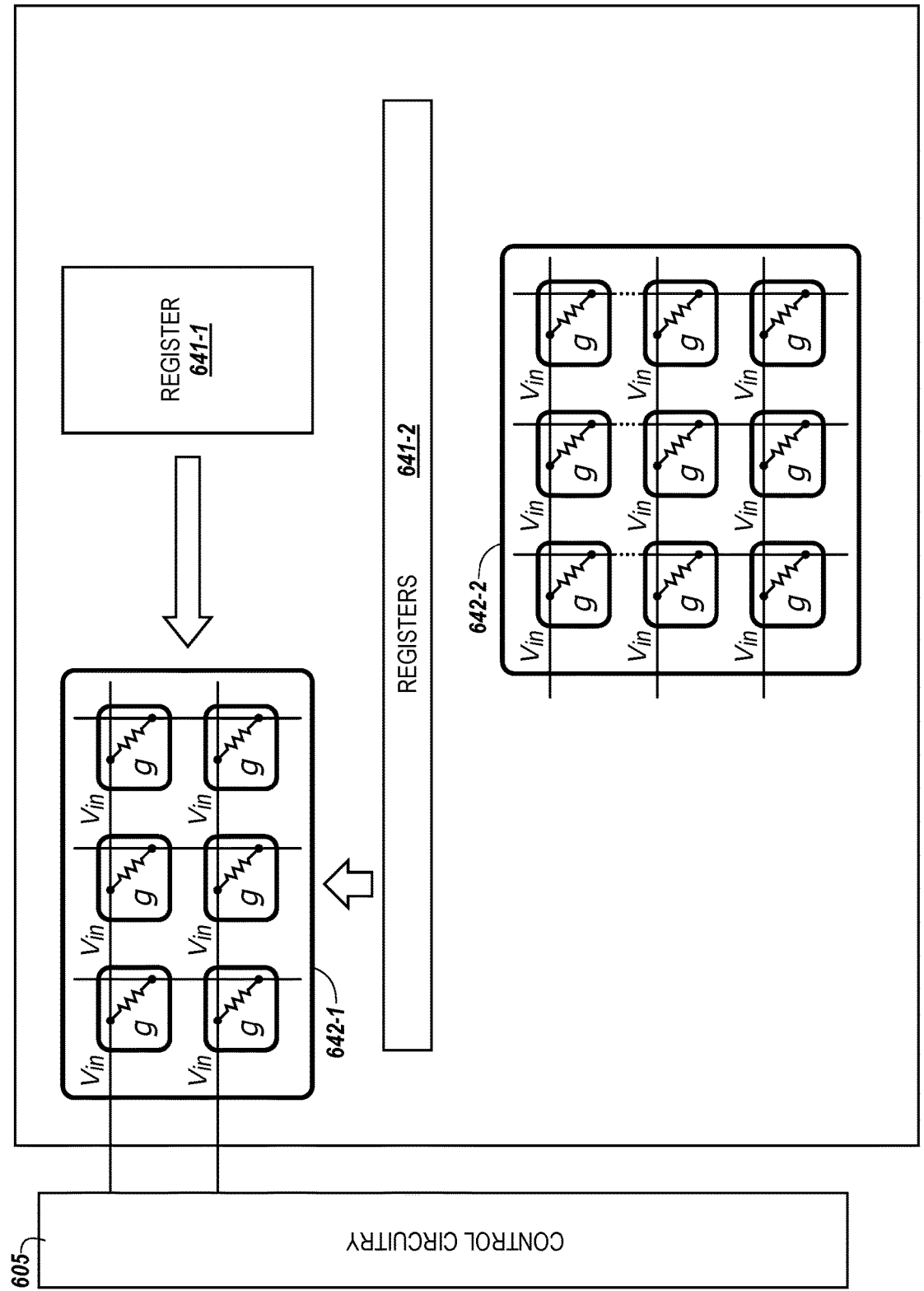
FIG. 6 illustrates an example flow for updating weights in accordance with a number of embodiments of the present disclosure.

FIG. 6 illustrates an example flow for updating weights in accordance with a number of embodiments of the present disclosure. The banks used to update the weights of a layer of a Bayesian neural network can be fewer than the banks used to perform backward propagation which can be fewer than the banks used to perform forward propagation.

A register 641-2 can provide the partial derivative $$\frac{\partial F(w, \theta)}{\partial w}$$

and the registers 641-1 can provide the partial derivative $$\frac{\partial F(w, \theta)}{\partial \mu}$$

as inputs to the bank 642-1 to update the mean of the weights w of a particular layer of the Bayesian neural network such that $$\mu \leftarrow \mu - \alpha\left(\frac{\partial F(w, \theta)}{\partial w} + \frac{\partial F(w, \theta)}{\partial \mu}\right)$$

where $\alpha$ is a constant. The registers 641-1 can provide the partial derivative $$\frac{\partial F(w, \theta)}{\partial w}$$

and the registers 641-1 can provide the partial derivative $$\frac{\partial F(w, \theta)}{\partial \rho}$$

as inputs to the bank 642-1 to update the standard deviation such that $$\rho \leftarrow \rho - \alpha\left(\frac{\partial F(w, \theta)}{\partial w}\frac{\epsilon}{1 + \exp(-\rho)} + \frac{\partial F(w, \theta)}{\partial \rho}\right).$$

$\epsilon$ is a stochastic pulse. $\rho$ is stored in the bank 642-1 along with other parameters. A portion of $$\rho - \alpha\left(\frac{\partial F(w, \theta)}{\partial w}\frac{\epsilon}{1 + \exp(-\rho)} + \frac{\partial F(w, \theta)}{\partial \rho}\right)$$

can be calculated externally from the banks 642-1 and 642-2 such as by an arithmetic unit. The arithmetic unit can be internal to the controller 605 or external to the controller 605. The bank 642-1 can receive the inputs through the sense lines and the access lines to update the values stored in the memory cells. The addition of the partial derivatives $$\frac{\partial F(w, \theta)}{\partial w} + \frac{\partial F(w, \theta)}{\partial \mu}$$

represents the gradient with respect to the mean. The gradient with respect to the standard deviation is expressed as $$\frac{\partial F(w, \theta)}{\partial w} \frac{\epsilon}{1 + \exp(-\rho)} + \frac{\partial F(w, \theta)}{\partial \rho},$$

wherein $\epsilon$ is a constant. In various instances y and p for the weights can be updated concurrently or separately.

The updated parameters $\theta$ can be used to perform forward propagation of the corresponding layer utilizing the bank 642-1. The bank 642-2 is shown in FIG. 6 to show that a single bank 642-1 is used and to show that the bank that stores the parameters $\theta$ for a layer of the Bayesian neural network can also be used to update the parameters $\theta$. Although the operations performed in the banks of the memory array are described as being performed utilizing four banks, the operations corresponding to a layer of the Bayesian neural network can be performed with a fewer or a greater number of banks. For example, forward propagation, backward propagation, and weight updating for a particular layer of the Bayesian neural network can be performed utilizing one bank, two banks, three banks, four banks, and/or five or more banks.

Figure 7:
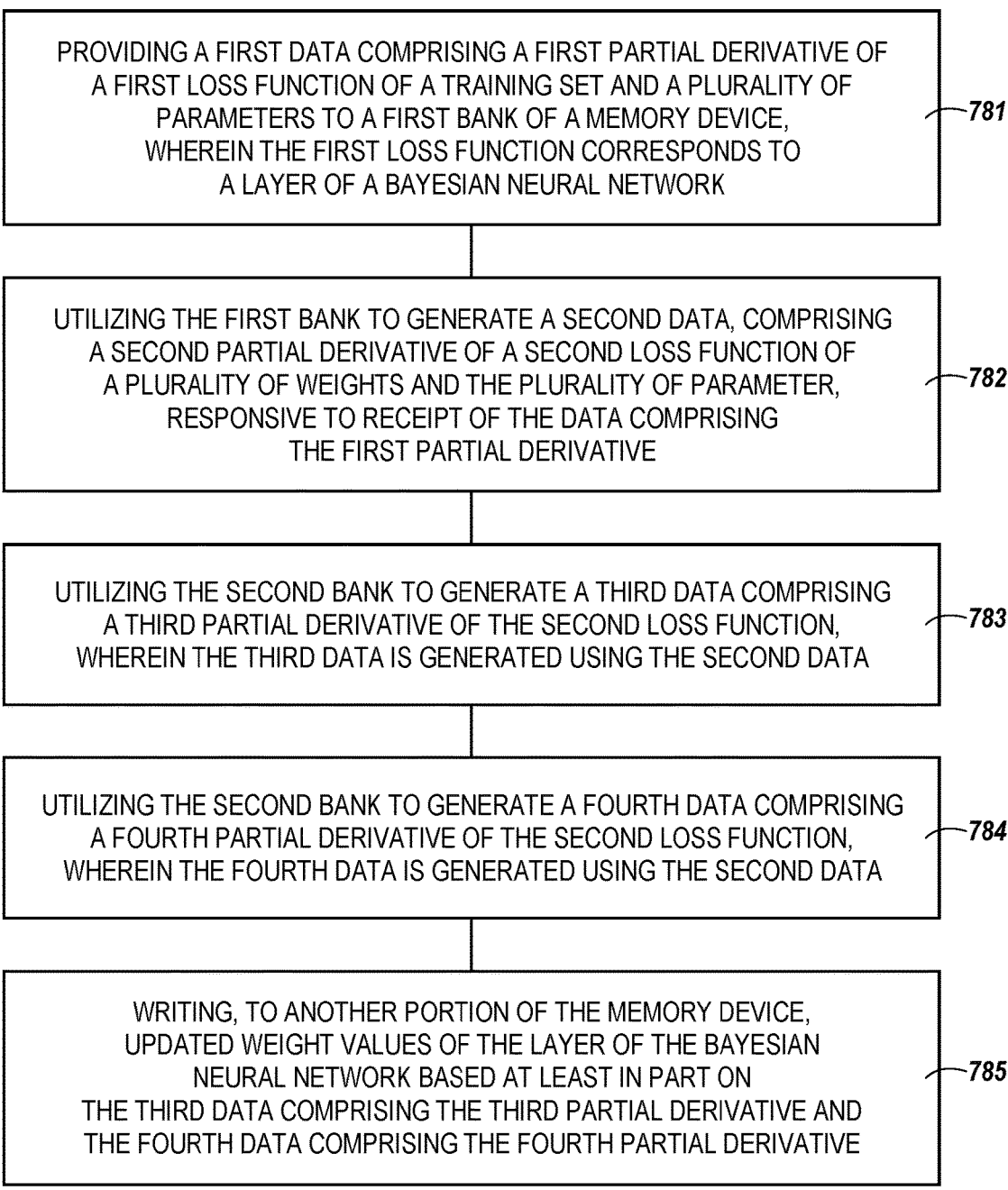
FIG. 7 illustrates an example flow diagram of a method for implementing a Bayesian neural network in memory in accordance with a number of embodiments of the present disclosure.

FIG. 7 illustrates an example flow diagram of a method 780 for implementing a Bayesian neural network in memory in accordance with a number of embodiments of the present disclosure. The method 780 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 780 is performed by the control circuitry (e.g., controller) 105 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 781, a first data comprising a first partial derivative of a first loss function of a training set and a plurality of parameters can be provided to a first bank of a memory device, wherein the first loss function corresponds to a layer of a Bayesian neural network. The first partial derivative is provided as $$\frac{\partial F(D, \theta)}{\partial \theta}.$$

At 782, the first bank is utilized to generate a second data, comprising a second partial derivative of a second loss function of a plurality of weights and the plurality of parameter, responsive to receipt of the data comprising the first partial derivative. The second partial derivative is provided as $$\frac{\partial F(w, \theta)}{\partial w}.$$

At 783, the second bank is utilized to generate a third data comprising a third partial derivative of the second loss function, wherein the third data is generated using the second data.

At 784, the second bank can be utilized to generate a fourth data comprising a fourth partial derivative of the second loss function, wherein the fourth data is generated using the second data. The third partial derivative is provided as $$\frac{\partial F(w, \theta)}{\partial \mu}$$

and the fourth partial derivative is provided as $$\frac{\partial F(w, \theta)}{\partial \rho}.$$

At 785, updated weight values of the layer of the Bayesian neural network can be written, to another portion of the memory device, based at least in part on the third data comprising the third partial derivative and the fourth data comprising the fourth partial derivative.

The first loss function can be generated at one of a controller of the memory device and a third bank of the memory device. The first loss function can provide a measure of the divergence between a variational posterior (e.g., $q(w^i|\theta)$), a prior (e.g., $P(w^i)$), and a measure of fit (e.g., log $P(D|w^i)$) between the plurality of weights and the training data of the Bayesian neural network. The variational posterior and the prior can be generated using different banks of the memory device. For example, the variational posterior and the prior can be generated in banks other than the first bank and the second bank.

The second partial derivative can be stored in a first plurality of registers of the memory device to make the second partial derivative available to the second bank and available for updating the plurality of deterministic values (e.g., $\theta$) of the Bayesian neural network. The third partial derivative and the fourth partial derivative can be stored in a second plurality of registers to make the third partial derivative and the fourth partial derivative available for updating the plurality of deterministic values of the Bayesian neural network.

In different examples, a plurality of deterministic values can be accessed from a first plurality of memory cells of the memory array. A first plurality of weight values and a first plurality of bias values can be generated based on the plurality of deterministic values, where the plurality of weight values and the plurality of bias values are generated using a second plurality of memory cells of the memory array. A second plurality of weight values and a second plurality of bias values can be generated based on the first plurality of weight values and the second plurality of bias values, where the second plurality of weight values and the second plurality of bias values are generated using a third plurality of memory cells of the memory array. A result and a confidence in the result can be determined utilizing an input provided by a host, the second plurality of weight values, and the second plurality of bias values of a Bayesian neural network, where the result and the confidence is an output of a fourth plurality of memory cells of the memory array.

The deterministic values can comprise a weight mean, a weight standard deviation, a bias mean, and a bias standard deviation of a plurality of layers, implemented in the memory array, of the Bayesian neural network. A controller of a memory device can access the plurality of deterministic values, generate the first plurality of weight values and the first plurality of bias values, generate the second plurality of weight values and the second plurality of bias values, and determine the result and the confidence in the result utilizing a plurality of banks. The plurality of banks can comprise the first plurality of memory cells, the second plurality of memory cells, the third plurality of memory cells, and the fourth plurality of memory cells. For example, the first plurality of memory cells can comprise a first bank, the second plurality of memory cells can comprise a second bank, third plurality of memory cells can comprise a third bank, and the fourth plurality of memory cells can comprise a fourth bank. The first bank, the second bank, the third bank, and the fourth bank can comprise a layer of the Bayesian neural network.

In various examples, the first plurality of memory cells, the second plurality of memory cells, and the third plurality of memory cells can comprise a first bank and the fourth plurality of memory cells can comprise a second bank. The first bank and the second bank can comprise a layer of the Bayesian neural network.

In various instances, the first plurality of weight values, the first plurality of bias values, the second plurality of weight values, and the second plurality of bias values of the Bayesian neural network can be sampled utilizing a number of Bayesian pulse generators coupled to the memory array. The first plurality of weight values and the first plurality of bias values of the Bayesian neural network can be sampled utilizing a first stochastic pulse generator of the number of stochastic pulse generators. A second plurality of weight values of the Bayesian neural network can also be sampled utilizing a second stochastic pulse generator of the number of stochastic pulse generators.

The number of stochastic pulse generators can be controlled to provide a first plurality of voltage pulses to a first plurality of signal lines to which the second plurality of memory cells are coupled to sample the first plurality of weight values and the first plurality of bias values. The stochastic pulse generators can also be configured to provide a second plurality of voltage pulses to a second plurality of signal lines to which the third plurality of memory cells are coupled to sample the second plurality of weight values and the second plurality of bias values.

The first plurality of voltage pulses can cause a first plurality of currents to be emitted from the second plurality of memory cells based on a resistance of the second plurality of memory cells. The second plurality of voltage pulses can cause a second plurality of currents to be emitted from the third plurality of memory cells based on a resistance of the third plurality of memory cells.

The second plurality of memory cells can be coupled to a first plurality of different signal lines, where the third plurality of memory cells are coupled to a second plurality of different signal lines. The first plurality of currents can be provided to an analog-to-digital converter via the first plurality of different signal lines. The first plurality of currents can represent the first plurality of weight values and the first plurality of bias values. The second plurality of currents can be provided to a different analog-to-digital converter via the second plurality of different signal lines, wherein the second plurality of currents represent the second plurality of weight values and the second plurality of bias values of the Bayesian neural network.

The analog-to-digital converter can generate a first plurality of output voltages corresponding to the first plurality of currents. A second plurality of output voltages corresponding to the second plurality of currents can be generated, utilizing the different analog-to-digital converter. The second plurality of output voltages represent the second plurality of weight values and the second plurality of bias values that are sampled.

The plurality of registers can store a first plurality of values corresponding to the first plurality of output voltages and a second plurality of values corresponding to the second plurality of output voltages to make the first plurality of values and the second plurality of values available to the different stochastic pulse generator and the fourth plurality of memory cells.

Various examples can implement a system comprising a controller coupled to a memory device and a plurality of register. The controller can be configured to access a first partial derivative of a loss function with regards to a mean of a plurality of deterministic values of a Bayesian neural network from the plurality of registers, access a second partial derivative of the loss function with regards to a standard deviation of the plurality of deterministic values from the plurality of registers, access a third partial derivative of the loss function with regards to a plurality of weight values of the Bayesian network from the plurality of registers, and updating a resistance of the plurality of memory cells to store an updated plurality of deterministic values. The resistance of the plurality of memory cells can be updated using the first partial derivative, the second partial derivative, and the third partial derivative.

A first plurality of voltages corresponding to the first partial derivative and the second partial derivative can be applied to a first plurality of signal lines. A second plurality of voltages corresponding to the third partial derivative can be applied to a second plurality of signal lines, where each of the plurality of memory cells are coupled to respective ones of the first plurality of signal lines and the second plurality of signal lines. Applying the first plurality of voltage and the second plurality of voltage can update the resistance of the plurality of memory cells. The resistance of the plurality of memory cells can represent a plurality of deterministic values of the Bayesian neural network.

Figure 8:
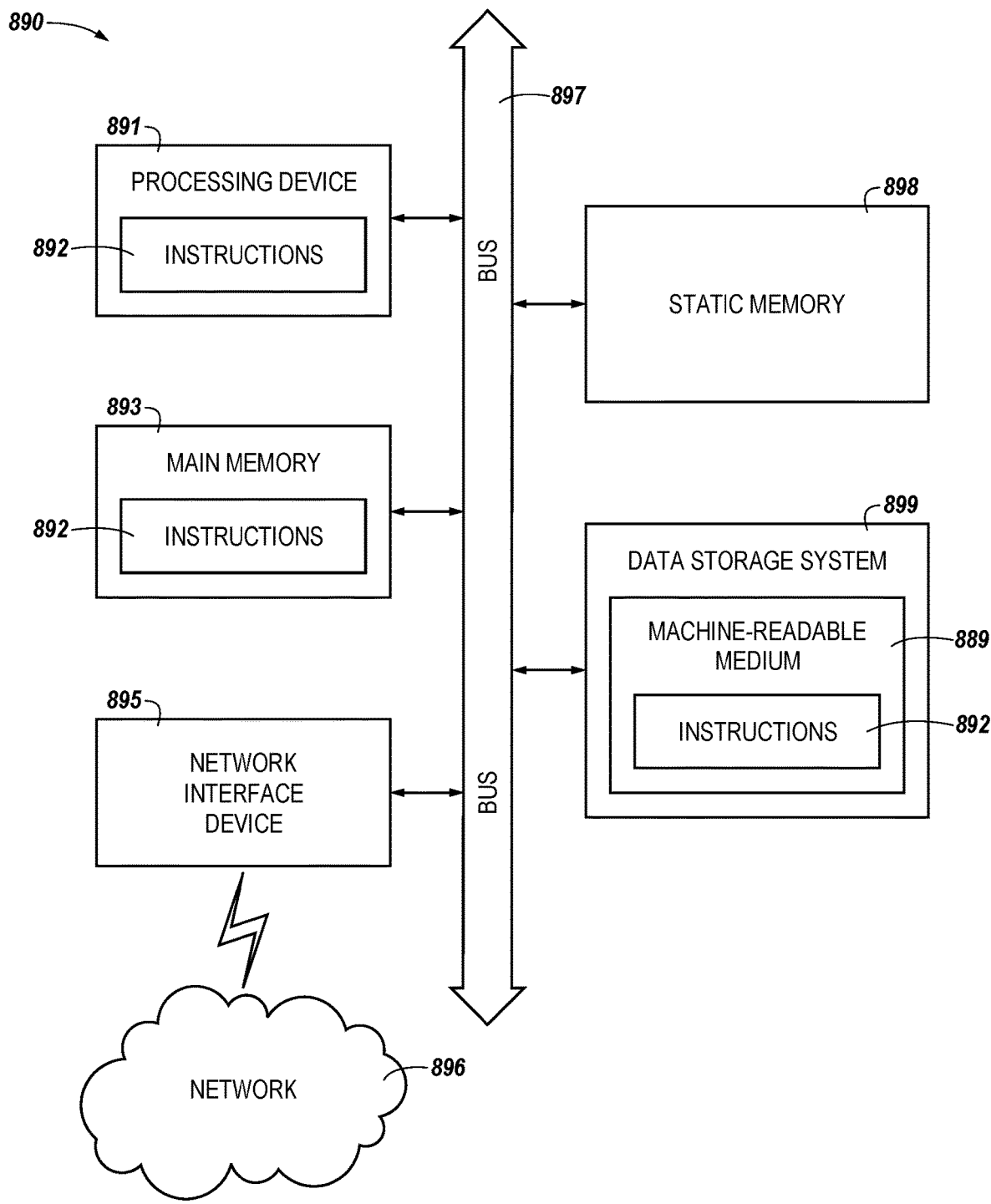
FIG. 8 illustrates an example machine of a computer system within which a set of instructions, for causing the machine to perform various methodologies discussed herein, can be executed.

FIG. 8 illustrates an example machine of a computer system 890 within which a set of instructions, for causing the machine to perform various methodologies discussed herein, can be executed. In various embodiments, the computer system 890 can correspond to a system (e.g., the computing system 100 of FIG. 1) that includes, is coupled to, or utilizes a memory sub-system (e.g., the memory device 103 of FIG. 1) or can be used to perform the operations of a controller (e.g., the controller circuitry 105 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 890 includes a processing device 891, a main memory 893 (e.g., read-only memory (ROM), flash memory, dynamic random access memory (DRAM) such as synchronous DRAM (SDRAM) or Rambus DRAM (RDRAM), etc.), a static memory 897 (e.g., flash memory, static random access memory (SRAM), etc.), and a data storage system 899, which communicate with each other via a bus 897.

Processing device 891 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 891 can also be one or more special-purpose processing devices such as an application specific integrated circuit (ASIC), a field programmable gate array (FPGA), a digital signal processor (DSP), network processor, or the like. The processing device 891 is configured to execute instructions 892 for performing the operations and steps discussed herein. The computer system 890 can further include a network interface device 895 to communicate over the network 896.

The data storage system 899 can include a machine-readable storage medium 889 (also known as a computer-readable medium) on which is stored one or more sets of instructions 892 or software embodying any one or more of the methodologies or functions described herein. The instructions 892 can also reside, completely or at least partially, within the main memory 893 and/or within the processing device 891 during execution thereof by the computer system 890, the main memory 893 and the processing device 891 also constituting machine-readable storage media.

In one embodiment, the instructions 892 include instructions to implement functionality corresponding to the host 102 and/or the memory device 103 of FIG. 1. While the machine-readable storage medium 889 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory array;
   a controller coupled to the memory array and configured to:
   read data from a first plurality of memory cells of the memory array;
   generate, using a second plurality of memory cells of the memory array, a first plurality of weight values and a first plurality of bias values based on a plurality of deterministic values read from the first plurality of memory cells;
   generate, using a third plurality of memory cells of the memory array, a second plurality of weight values and a second plurality of bias values based on the first plurality of weight values and the second plurality of bias values; and transmit output data from a fourth plurality of memory cells of the memory array, the output data comprising a result and a confidence in the result that is based at least on:
  an input provided by a host,
  the second plurality of weight values, and
  the second plurality of bias values of a Bayesian neural network.

2. The apparatus of claim 1, wherein the deterministic values comprise a weight mean, a weight standard deviation, a bias mean, and a bias standard deviation of a plurality of layers, implemented in the memory array, of the Bayesian neural network.

3. The apparatus of claim 2, wherein the controller is further configured to:
  access the plurality of deterministic values, generate the first plurality of weight values and the first plurality of bias values, generate the second plurality of weight values and the second plurality of bias values, and determine the result and the confidence in the result utilizing a plurality of banks;
  wherein the plurality of banks comprise the first plurality of memory cells, the second plurality of memory cells, the third plurality of memory cells, and the fourth plurality of memory cells.

4. The apparatus of claim 3, wherein:
  the first plurality of memory cells comprises a first bank, the second plurality of memory cells comprises a second bank, third plurality of memory cells comprises a third bank, and the fourth plurality of memory cells comprises a fourth bank; and
  the first bank, the second bank, the third bank, and the fourth bank comprise a layer of the Bayesian neural network.

5. The apparatus of claim 3, wherein:
  the first plurality of memory cells, the second plurality of memory cells, and the third plurality of memory cells comprise a first bank and the fourth plurality of memory cells comprises a second bank; and
  the first bank and the second bank comprise a layer of the Bayesian neural network.

6. The apparatus of claim 1, wherein the controller is further configured to sample the first plurality of weight values, the first plurality of bias values, the second plurality of weight values, and the second plurality of bias values of the Bayesian neural network utilizing a number of stochastic pulse generators coupled to the memory array.

7. The apparatus of claim 6, wherein the controller is further configured to sample the first plurality of weight values and the first plurality of bias values of the Bayesian neural network utilizing a first stochastic pulse generator of the number of stochastic pulse generators and a second plurality of weight values of the Bayesian neural network utilizing a second stochastic pulse generator of the number of stochastic pulse generators.

8. The apparatus of claim 6, wherein the controller is configured to control the number of stochastic pulse generators to:
  provide a first plurality of voltage pulses to a first plurality of signal lines to which the second plurality of memory cells are coupled to sample the first plurality of weight values and the first plurality of bias values; and
  provide a second plurality of voltage pulses to a second plurality of signal lines to which the third plurality of memory cells are coupled to sample the second plurality of weight values and the second plurality of bias values.

9. The apparatus of claim 8, wherein:
  the first plurality of voltage pulses cause a first plurality of currents to be emitted from the second plurality of memory cells based on a resistance of the second plurality of memory cells; and
  the second plurality of voltage pulses cause a second plurality of currents to be emitted from the third plurality of memory cells based on a resistance of the third plurality of memory cells.

10. The apparatus of claim 9, wherein the second plurality of memory cells are coupled to a first plurality of different signal lines;
  wherein the third plurality of memory cells are coupled to a second plurality of different signal lines; and
  wherein the controller is further configured to control the memory array to:
    provide the first plurality of currents via the first plurality of different signal lines to an analog-to-digital converter, wherein the first plurality of currents represent the first plurality of weight values and the first plurality of bias values; and
    provide the second plurality of currents via the second plurality of different signal lines to a different analog-to-digital converter, wherein the second plurality of currents represent the second plurality of weight values and the second plurality of bias values of the Bayesian neural network.

11. The apparatus of claim 10, wherein the controller is further configured to:
  generate, utilizing the analog-to-digital converter, a first plurality of output voltages corresponding to the first plurality of currents;
  generate, utilizing the different analog-to-digital converter, a second plurality of output voltages corresponding to the second plurality of currents, wherein the second plurality of output voltages represent the second plurality of weight values and the second plurality of bias values that are sampled.

12. The apparatus of claim 11, further comprising a plurality of registers and wherein the controller is further configured to:
  store a first plurality of values corresponding to the first plurality of output voltages and a second plurality of values corresponding to the second plurality of output voltages in the plurality of registers to make the first plurality of values and the second plurality of values available to the different stochastic pulse generator and the fourth plurality of memory cells.

13. A method, comprising:
  providing a first data comprising a first partial derivative of a first loss function of a training set and a plurality of parameters to a first bank of a memory device, wherein the first loss function corresponds to a layer of a Bayesian neural network;
  utilizing the first bank to generate a second data, comprising a second partial derivative of a second loss function of a plurality of weights and the plurality of parameter, responsive to receipt of the data comprising the first partial derivative;
  utilizing the second bank to generate a third data comprising a third partial derivative of the second loss function, wherein the third data is generated using the second data;

utilizing the second bank to generate a fourth data comprising a fourth partial derivative of the second loss function, wherein the fourth data is generated using the second data; and writing, to another portion of the memory device, updated weight values of the layer of the Bayesian neural network based at least in part on the third data comprising the third partial derivative and the fourth data comprising the fourth partial derivative.

14. The method of claim 13, further comprising:

generating the first loss function at one of a controller of the memory device and a third bank of the memory device; and wherein the first loss function provides a measure of the divergence between a variational posterior, a prior, and a measure of fit between the plurality of weights and the training data of the Bayesian neural network.

15. The method of claim 14, further comprising generating the variational posterior and the prior in different banks of the memory device.

16. The method of claim 13, further comprising storing the second data comprising the second partial derivative in a first plurality of registers of the memory device to make the second partial derivative available to the second bank and available for updating the plurality of deterministic values of the Bayesian neural network.

17. The method of claim 16, further comprising storing the third data comprising the third partial derivative and the fourth data comprising the fourth partial derivative in a second plurality of registers to make the third partial derivative and the fourth partial derivative available for updating the plurality of deterministic values of the Bayesian neural network.

18. A system, comprising:
a memory device;
a plurality of registers;
a controller coupled to the memory device and the plurality of registers and configured to:
   access a first data representing a first partial derivative of a loss function of a Bayesian neural network from the plurality of registers;
   access a second data representing a second partial derivative of the loss function from the plurality of registers;
   access a third data representing a third partial derivative of the loss function from the plurality of registers; and
   update a resistance of the plurality of memory cells, to store an updated plurality of deterministic values, utilizing the first data, the second data, and the third data.

19. The system of claim 18, wherein the controller configured to update the resistance of the plurality of memory cells is further configured to:
   apply a first plurality of voltages corresponding to the first partial derivative and the second partial derivative to a first plurality of signal lines; and
   apply a second plurality of voltages corresponding to the third partial derivative to a second plurality of signal lines, wherein the each of the plurality of memory cells are coupled to respective ones of the first plurality of signal lines and the second plurality of signal lines and wherein applying the first plurality of voltage sand the second plurality of voltage updates the resistance of the plurality of memory cells.

20. The system of claim 18, wherein the resistance of the plurality of memory cells represents a plurality of deterministic values of the Bayesian neural network.

* * * * *